(12) United States Patent
Sakaguchi (10) Patent No.: US 7,514,351 B2
(45) Date of Patent: Apr. 7, 2009

(54) SOLDER BALL MOUNTING METHOD AND SOLDER BALL MOUNTING SUBSTRATE MANUFACTURING METHOD

(75) Inventor: Hideaki Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/877,084

(22) Filed: Oct. 23, 2007

(65) Prior Publication Data
US 2008/0102620 A1 May 1, 2008

(30) Foreign Application Priority Data
Oct. 25, 2006 (JP) .............. 2006-290288

(51) Int. Cl.
*H01L 21/44* (2006.01)
(52) U.S. Cl. .............. 438/615; 438/612; 438/613; 438/614; 257/772; 257/779; 257/E21.508
(58) Field of Classification Search .............. 438/612, 438/613, 614, 615; 257/772, 779, E21.508
See application file for complete search history.

(56) References Cited

U.S. PATENT DOCUMENTS

| 5,447,264 | A | * | 9/1995 | Koopman et al. | 228/56.3 |
| 5,461,261 | A | * | 10/1995 | Nishiguchi | 257/781 |
| 5,536,677 | A | * | 7/1996 | Hubacher | 438/613 |
| 5,872,404 | A | * | 2/1999 | Lynch et al. | 257/781 |
| 6,180,505 | B1 | * | 1/2001 | Uzoh | 438/614 |
| 6,429,531 | B1 | * | 8/2002 | Mistry et al. | 257/780 |
| 6,524,943 | B1 | * | 2/2003 | Sakuyama | 438/613 |
| 6,897,142 | B2 | * | 5/2005 | Fujimori et al. | 438/615 |
| 7,007,834 | B2 | * | 3/2006 | Zakel | 228/56.3 |
| 7,119,000 | B2 | * | 10/2006 | Shimizu et al. | 438/597 |
| 7,265,044 | B2 | * | 9/2007 | Ohta et al. | 438/612 |
| 7,291,517 | B2 | * | 11/2007 | Sakurai et al. | 438/106 |
| 2001/0008310 | A1 | * | 7/2001 | Sakuyama et al. | 257/737 |
| 2002/0195170 | A1 | * | 12/2002 | Nomura et al. | 148/23 |
| 2003/0096495 | A1 | * | 5/2003 | Ihara et al. | 438/614 |
| 2004/0180527 | A1 | * | 9/2004 | Shimizu et al. | 438/615 |
| 2004/0209451 | A1 | * | 10/2004 | Kukimoto et al. | 438/612 |
| 2005/0112800 | A1 | * | 5/2005 | Yamano | 438/113 |
| 2005/0194686 | A1 | * | 9/2005 | Iwazaki et al. | 257/738 |
| 2005/0230851 | A1 | * | 10/2005 | Nakano et al. | 257/784 |
| 2006/0110907 | A1 | * | 5/2006 | Sakurai et al. | 438/612 |

FOREIGN PATENT DOCUMENTS

| JP | 2001-358450 | 12/2001 |
| JP | 2006-005276 | 1/2006 |

* cited by examiner

*Primary Examiner*—N Drew Richards
*Assistant Examiner*—Ankush K Singal
(74) *Attorney, Agent, or Firm*—Rankin, Hill & Clark LLP (57) ABSTRACT

A solder resist having first opening portions on positions corresponding to electrodes and a second opening portion on a mask providing position is formed on the substrate. A flux mask whose thickness is substantially same as the solder resist is arranged in the second opening portion and then a flux is filled in the first opening portions. The flux mask is removed and then a solder ball mounting mask is arranged over the substrate such that its supporting portion is positioned in the second opening portion. Solder balls are mounted on the flux formed on the electrodes by using the solder ball mounting mask. The solder ball mounting mask is removed and then the solder balls are joined to the electrodes by executing the heating process.

4 Claims, 9 Drawing Sheets

SOLDER BALL MOUNTING METHOD AND SOLDER BALL MOUNTING SUBSTRATE MANUFACTURING METHOD

This application claims priority to Japanese Patent Application No. 2006-290288, filed Oct. 25, 2006, in the Japanese Patent Office. The priority application is incorporated by reference in its entirety.

TECHNICAL FIELD

The present disclosure relates to a solder ball mounting method and a solder ball mounting substrate manufacturing method. More particularly, the present disclosure relates to a solder ball mounting method for mounting fine solder balls on a substrate by using a solder ball mounting mask and a solder ball mounting substrate manufacturing method.

RELATED ART

In recent years, a reduction in size and thickness of the electronic equipments typified by the mobile terminal device, and the like is advancing rapidly. Also, a reduction in size and thickness is demanded of the electronic components such as the semiconductor device, etc. packaged in these electronic equipments. On the other hand, these electronic components are moving toward a higher density and thus a tendency to increase the number of connection terminals becomes conspicuous.

As the electronic component packaging method to meet these demands, the method of flip chip (FC) mounting solder balls as external connection terminals on a substrate is used commonly in recent. This flip chip mounting method is such a method that the solder balls are mounted previously on electrodes provided to the substrate of the electronic components and then the solder balls are joined directly to electrodes of a mounting substrate.

For this reason, when the flip chip mounting method is applied, the solder balls must be mounted in advance on the substrate of the electronic components. As this solder ball mounting method of mounting the solder balls on the substrate, such a method is used commonly that a flux is applied onto the electrodes of the substrate on which the solder balls are mounted, then the solder balls are placed on the flux, and then the solder balls are melted by heating and joined to the electrodes (see Japanese Patent Unexamined Publication No. 2006-005276, for example).

FIG. 5A to FIG. 9B are views explaining concrete examples of the solder ball mounting method in the related art. FIG. 5A to FIG. 7B show the solder ball mounting method as the first related art, and FIG. 8A to FIG. 9B show the solder ball mounting method as the second related art.

Figure 5A:
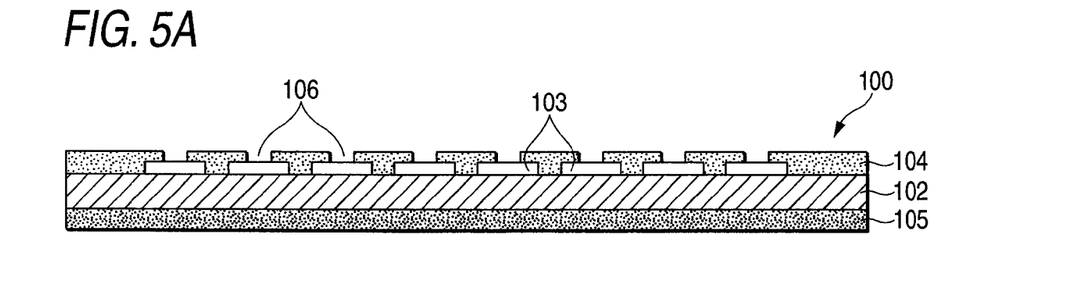
FIGS. 5A to 5C are views explaining a solder ball mounting method as the first related art.

First, the solder ball mounting method as the first related art will be explained hereunder. FIG. 5A shows a substrate 100. In the substrate 100, a solder resist 104 is formed on an upper surface of a substrate main body 102 and an insulating film 105 is formed on a lower surface thereof. Also, a plurality of electrodes 103 are formed on an upper surface of the substrate 100, and opening portions 106 are formed in the solder resist 104 in positions that oppose to the electrodes 103.

Figure 5B:
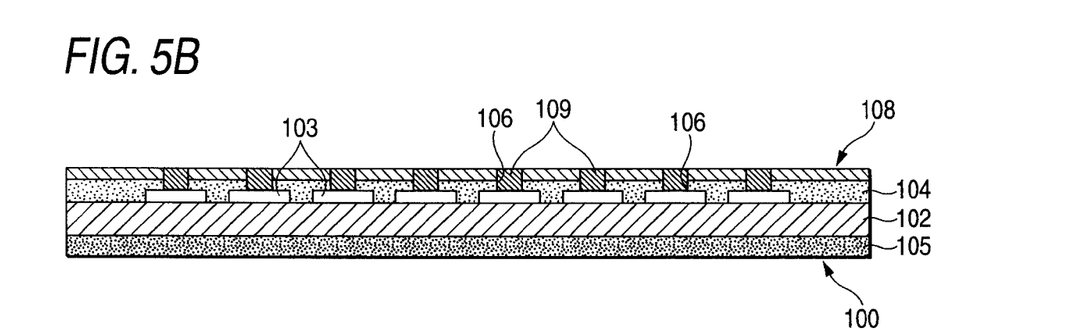

In order to mount solder balls 115 on the substrate 100, a flux mask 108 is arranged on the substrate 100 (the solder resist 104). Openings are formed in the flux mask 108 in positions that face to the opening portions 106. Then, a flux 109 is filled in the opening portions 106 by the printing, or the like while using the flux mask 108. FIG. 5B shows a state that the flux 109 is filled in the opening portions 106.

Figure 5C:
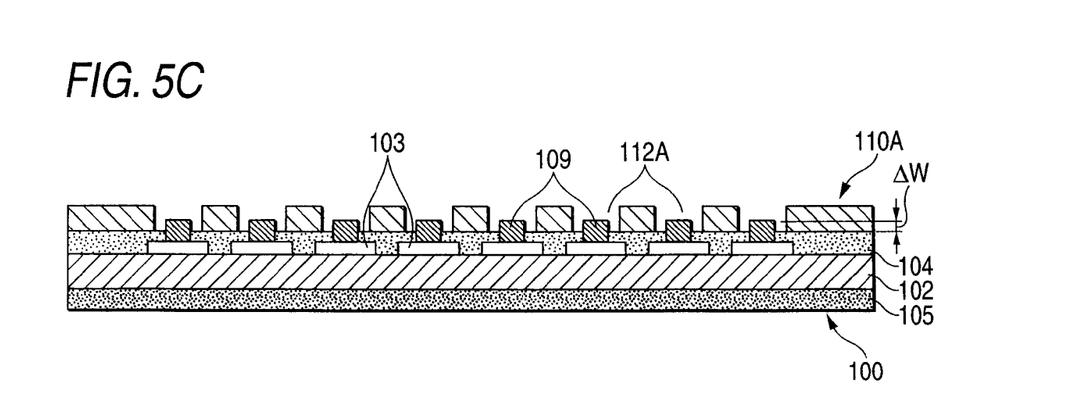

As soon as the filling of the flux 109 in the opening portions 106 is completed, the flux mask 108 is removed. Then, as shown in FIG. 5C, a ball mounting mask 110A is arranged over the substrate 100 (the solder resist 104). A plurality of ball feeding openings 112A used to mount (feed) solder balls 115 on the flux 109 are formed in the ball mounting mask 110A.

Figure 6A:
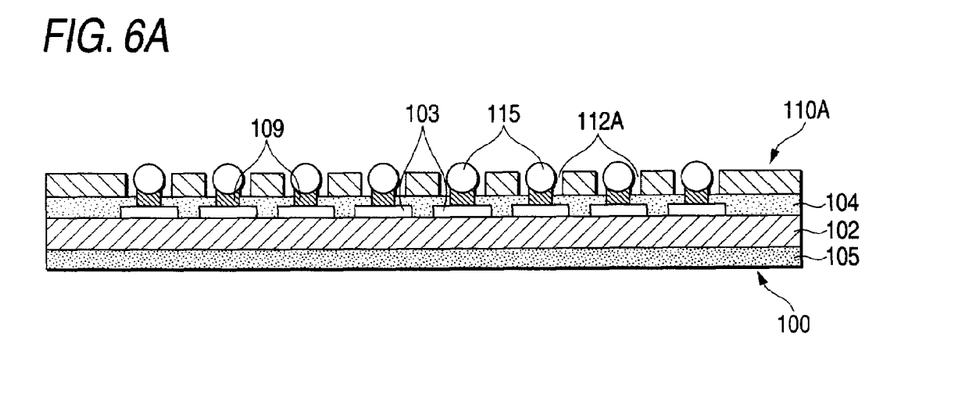
FIGS. 6A to 6C are views explaining the solder ball mounting method as the first related art.

After the ball mounting mask 110A is arranged over the substrate 100, the solder balls 115 are fed onto the ball mounting mask 110A. Then, the solder balls 115 are moved by using the squeegee, for example, and are fed into the ball feeding openings 112A. FIG. 6A shows a state that the solder balls 115 are fed into the openings 112A. In this state, respective solder balls 115 are mounted (temporarily fitted) on the flux 109 with a viscosity.

Figure 6B:
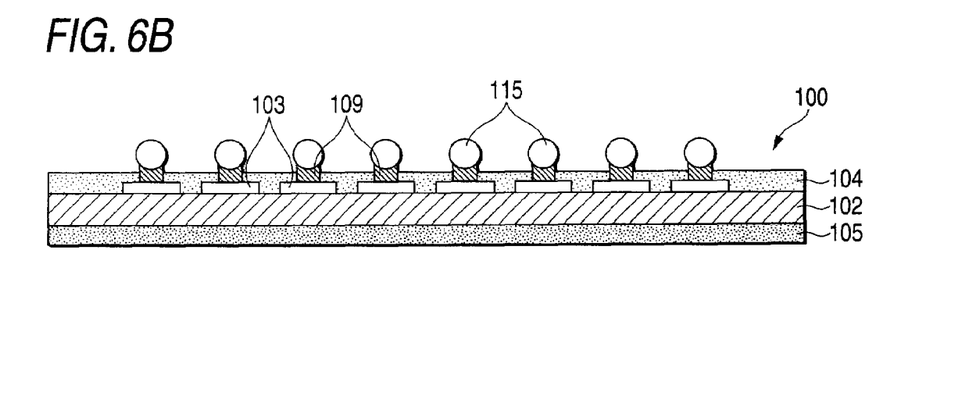
Figure 6C:
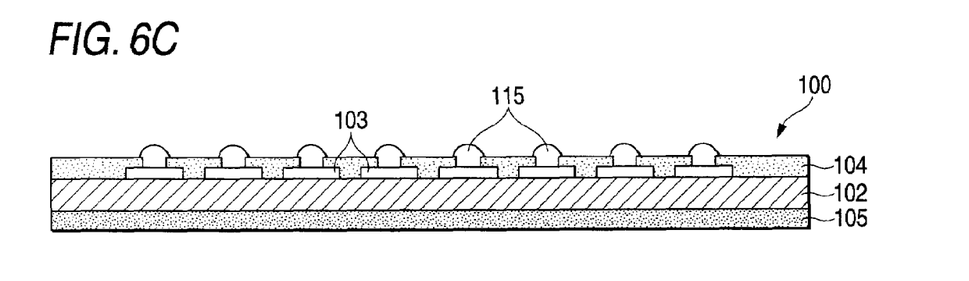

After the solder balls 115 are mounted on the flux 109, the ball mounting mask 110A is removed from the substrate 100. FIG. 6B shows a state that the mask 110A is removed from the substrate 100. Then, the heating process such as the reflowing process, or the like is executed, and the solder balls 115 are joined to the electrodes 103. Accordingly, the solder balls 115 are mounted on the substrate 100 (the substrate 100 on which the solder balls 115 are mounted is called a ball-mounted substrate).

Next, the solder ball mounting method as the second related art will be explained with reference to FIG. 8A to FIG. 9B hereunder. In FIG. 8A to FIG. 9B, the same symbols are affixed to the same configurations as those shown in FIG. 5A to FIG. 6C and their explanation will be omitted herein.

Figure 8A:
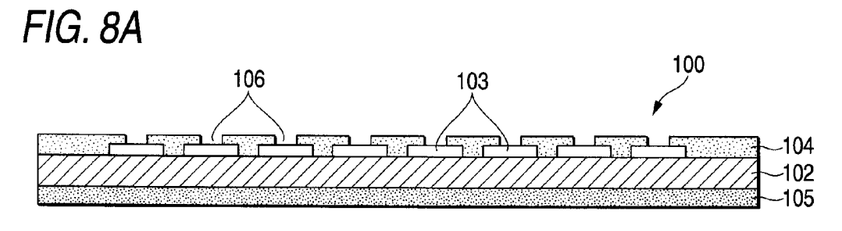
FIGS. 8A to 8C are views explaining a solder ball mounting method as the second related art.

The substrate 100 shown in FIG. 8A is similar to the substrate 100 shown in FIG. 5A. In the second related art, the printing process of the flux 109 is directly applied without provision of the flux mask 108 on the substrate 100.

Figure 8B:
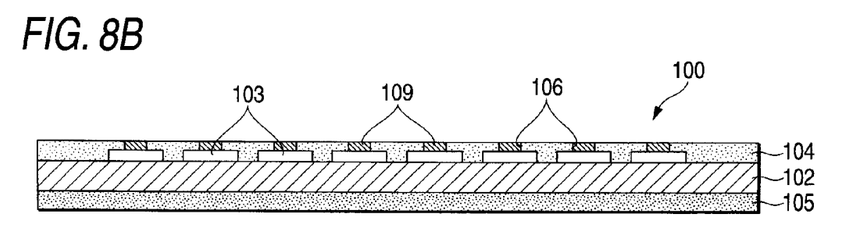

FIG. 8B shows a state that the flux 109 is printed on the substrate 100. As shown in FIG. 8B, the flux 109 is filled in the opening portions 106 that are formed in the solder resist 104. At this time, the flux 109 is slightly left on an upper surface of the solder resist 104.

Figure 8C:
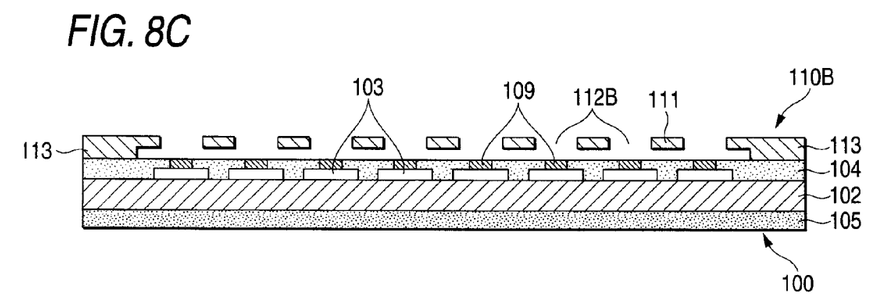

Then, as shown in FIG. 8C, a ball mounting mask 110B is provided onto the substrate 100. This ball mounting mask 110B is composed of a mask portion 111 and a supporting portion 113. A plurality of ball feeding openings 112B used to mount the solder balls 115 on the substrate 100 are formed in the mask portion 111.

The mask portion 111 is supported by the supporting portion 113 such that this mask portion is away from an upper surface of the solder resist 104. In this manner, the mask portion 111 is separated from the upper surface of the solder resist 104, so that it can be prevented that the flux 109 remaining on the upper surface of the solder resist 104 adheres to the mask portion 111.

Figure 9A:
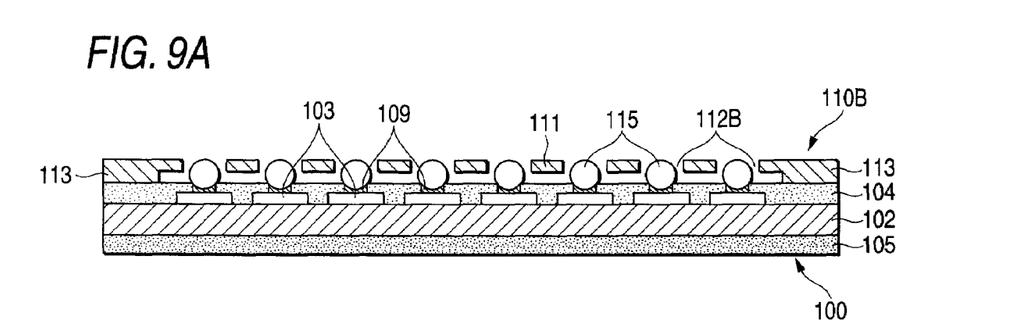
FIGS. 9A and 9B are views explaining the solder ball mounting method as the second related art.

After the ball mounting mask 110B is provided onto the substrate 100, the solder balls 115 are fed onto the ball mounting mask 110B. Then, the solder balls 115 are fed into the ball feeding openings 112B by using the squeegee. FIG. 9A shows a state that the solder balls 115 are fed into the ball feeding openings 112B. In this state, respective solder balls 115 are mounted (temporarily fitted) on the flux 109 with a viscosity.

After the solder balls 115 are mounted on the flux 109, the ball mounting mask 110B is removed. Then, the heating process such as the reflowing process, or the like is executed and the solder balls 115 are joined together to the electrodes 103. Accordingly, the ball-mounted substrate is manufactured.

As described above, in the solder ball mounting method in the first related art explained by using FIG. 5A to FIG. 6C, the flux mask 108 is used to fill the flux 109 into opening portions 106, as shown in FIG. 5B. Therefore, when the flux mask 108 is removed from the substrate 100 after the filling of the flux 109 is completed, the flux 109 is projected inevitably from the upper surface of the solder resist 104, as shown in FIG. 5C (In FIG. 5C, a height of projection is indicated by ΔW).

Therefore, it is feared that, upon fitting the ball mounting mask 110A to the substrate 100, or the like, the flux 109 projected from the solder resist 104 adheres to the ball mounting mask 110A (e.g., an inner wall of the ball feeding opening 112A). Also, it is feared that, when the flux 109 adheres to the ball mounting mask 110A in this way, the solder ball 115 adheres to the ball mounting mask 110A in removing the ball mounting mask 110A from the substrate 100 after the solder balls 115 are fed (In FIG. 7A, the solder ball adhered to the ball mounting mask 110A in this way is indicated particularly by a symbol 115A).

Figure 7A:
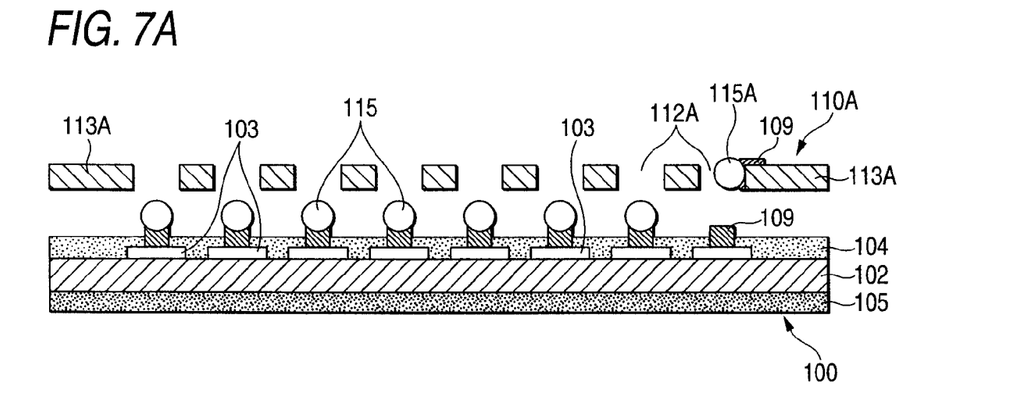
FIGS. 7A and 7B are views explaining the solder ball mounting method as the first related art.

Also, because the solder balls 115 are mounted on top end portions of the flux 109 projected from the upper surface of the solder resist 104, stability of the solder balls 115 is not good. For example, only when the ball mounting mask 110A touches slightly the solder ball 115 upon removing the ball mounting mask 11A, the solder ball 115 moves from the top end portion of the flux 109 (the solder ball being come off from the flux 109 in this way is indicated particularly by a symbol 115B).

Figure 7B:
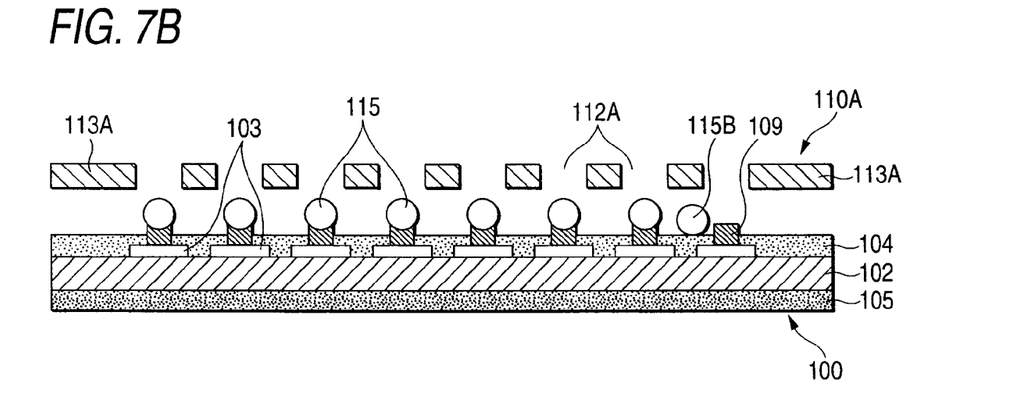

When the solder ball 115A adheres to the ball mounting mask 110A, as shown in FIG. 7A, or when the solder ball 115B moves from a predetermined position, as shown in FIG. 7B, the solder ball 115 does not exist in the predetermined position after the solder ball mounted substrate is completed. As a result, the solder ball mounting method in the first related art has the problem that reliability of the ball-mounted substrate is largely decreased. Also, because the solder ball 115 must be provided by separate step to the electrode 103 from which the solder ball 115 is lost, there existed such a problem that this repairing process is very troublesome.

Also, as the means for solving these problems, an approach for reducing a thickness of the flux mask 108 may be considered. However, the flux mask 108 must withstand an external force applied in printing the flux 109 and removing it from the substrate 100. Therefore, a predetermined mechanical strength must be provided to the flux mask 108.

As a consequence, no matter how the flux mask 108 is thinned, a thickness of the flux mask 108 of about 30 μm is needed at a minimum. However, even though a thickness of the flux mask 108 is set to about 30 μm, above problems arise similarly when the solder ball 115 has a minute diameter of 100 μm or so.

In contrast, in the solder ball mounting method in the second related art explained by using FIG. 8A to FIG. 9B, the supporting portion 113 is provided to the ball mounting mask 110B to keep the mask portion 111 away from the solder resist 104, whereby it can be prevented that the flux 109 adheres to the mask portion 111. Therefore, the solder ball 115 can be prevented from adhering to the ball mounting mask 110B.

Also, in the solder ball mounting method in the second related art, the flux 109 is filled directly in the opening portions 106 not to provide the flux mask 108 on the solder resist 104, unlike the first related art. Therefore, the flux 109 never projects from the upper surface of the solder resist 104, so that movement of the solder balls 115 can be prevented.

Figure 9B:
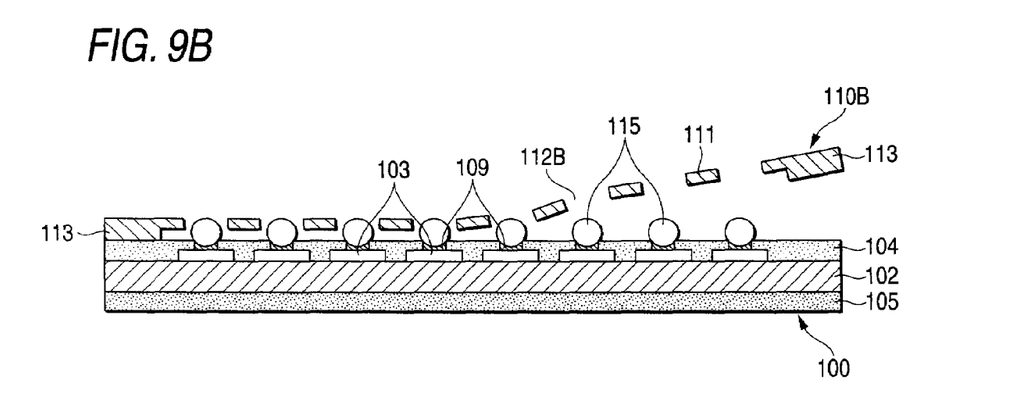

However, the supporting portion 113 of the ball mounting mask 110B is brought into contact with the upper surface of the solder resist 104, on which the flux 109 still remains. Therefore, it is possible that an adhesive force of the flux 109 causes the supporting portion 113 to adhere to the solder resist 104. In this case, as shown in FIG. 9B, the ball mounting mask 110B is deformed when it is removed. Thus, such a problem existed that the ball mounting mask 110B comes into touch with the solder ball 115 and moves it from a predetermined mounting position. Also, removal of the ball mounting mask 110B from the substrate 100 becomes troublesome. Thus, there exists the problem that a solder ball mounting operation cannot be carried out smoothly.

SUMMARY

Exemplary embodiments of the present invention provide a solder ball mounting method and a solder ball mounting substrate manufacturing method capable of mounting minute solder balls on a substrate with good precision and good workability.

A method of mounting solder balls on electrodes formed on a substrate, according to one or more embodiments of the present invention, includes a step of forming an insulating material, which has first opening portions on positions corresponding to the electrodes and a second opening portion on a position on which a mask is to be provided to expose the substrate, on the substrate; a step of arranging a first mask whose thickness is substantially same as the insulating material in the second opening portion and then filling a flux in the first opening portions by using the first mask; a step of removing the first mask from the substrate; a step of arranging a second mask having a masking portion, which has ball feeding openings formed in positions opposing to the electrodes, and a supporting portion, which supports the masking portions away from the flux, over the substrate such that the supporting portion is positioned in the second opening portion; a step of mounting the solder balls on the flux formed on the electrodes by using the second mask; a step of removing the second mask from the substrate; and a step of joining the solder balls to the electrodes.

Also, the insulating material may be a solder resist. Also, the substrate may be a wafer, and the second opening portion may be positioned in a dicing position of the wafer.

Also, a method of manufacturing a substrate in which solder balls are mounted on electrodes formed on a substrate main body, according to one or more embodiments of the present invention, includes a step of mounting the solder balls on the electrodes by using the solder ball mounting method.

According to the present invention, the flux is filled in the first opening portions after the first mask having an almost same thickness as the insulating material is provided in the second opening portions. Therefore, even after the first mask is removed from the substrate after the flux is filled, the flux never protrudes from the upper surface of the insulating material. Therefore, it can be prevented that the flux sticks to the second mask (solder ball mounting mask) used in the next step, and also it can be prevented that the solder balls adhere to the ball mounting mask and are removed from the substrate when the ball mounting mask is removed from the substrate after the solder balls are mounted on the flux. Also, it can be prevented that the solder balls move from (fall off) the flux since the flux does not protrude from the upper surface of the insulating material.

Also, the first mask is provided to the second opening portion in filling the flux in the first opening portions. Therefore, the position of the substrate corresponding to the second opening portion is covered with the first mask. As a result, the flux never sticks to portions of the substrate corresponding to the second opening portion in filling the flux. Also, the ball mounting mask is arranged over the substrate such that the supporting portion is positioned in the position of the second opening portion. Therefore, the supporting portion is never adhered to the substrate by the remaining flux. As a result, the solder ball mounting mask can be removed smoothly from the substrate and accordingly the solder ball can be prevented from moving from a predetermined position without fail.

Other features and advantages may be apparent from the following detailed description, the accompanying drawings and the claims.

DETAILED DESCRIPTION

Next, exemplary embodiments for carrying out the present invention will be explained with reference to the drawings hereinafter.

Figure 1A:
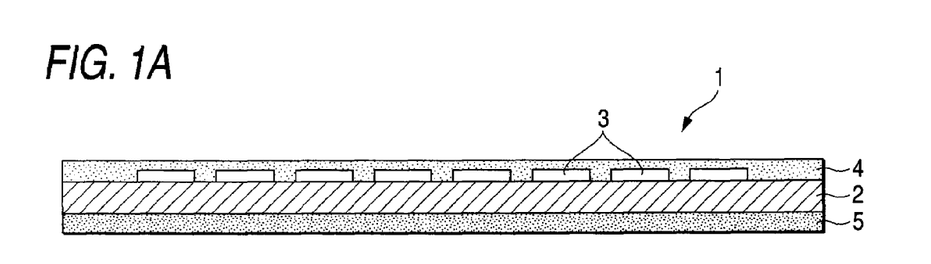
FIGS. 1A to 1D are views explaining a solder ball mounting method as an embodiment of the present invention in line with procedures.

FIG. 1A to FIG. 3D are views explaining a solder ball mounting method as an embodiment of the present invention in line with process procedures. FIG. 1A shows a substrate 1. This substrate 1 is constructed by a substrate main body 2, a solder resist 4 formed on an upper surface of the substrate main body 2, and an insulating film 5 formed on a lower surface of the substrate main body 2.

As the substrate main body 2, various types of substrates such as a resin substrate, a ceramic substrate, an Si wafer, a build-up substrate, and the like can be applied. A plurality of electrodes 3 are formed on the upper surface of the substrate main body 2.

In the present embodiment, assume that an example where a wafer is used as the substrate main body 2 will be explained hereunder. Also, a large number of element areas are formed on the wafer. In FIG. 1A to FIG. 3D except FIG. 1D, assume that only one element area (only an area indicated by A in FIG. 1D) of the wafer is shown in an enlarged manner as the substrate main body 2.

The solder resist 4 is an insulating material that is provided to suppress a solder short during the soldering process. For example, the solder resist 4 is formed on the overall upper surface of the substrate main body 2 by using the printing method, the method of laminating a sheet-like solder resist to have a predetermined thickness (e.g., 30 to 40 µm). As other insulating materials, an epoxy resin, a polyimide resin, or a silicon resin can be utilized. Also, the insulating film 5 is provided to protect a back surface of the substrate main body 2. In this case, provision of this insulating film 5 is not always needed. The method of the present invention can be implemented unless the insulating film 5 is provided.

Figure 1B:
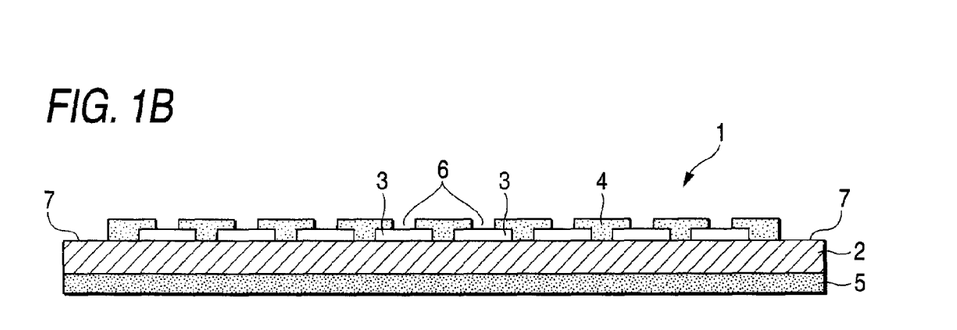

First, the process of forming first opening portions 6 and second opening portions 7 is applied to the substrate 1 constructed as above. Concretely, the solder resist 4 is a photosensitive material, and exposing/developing processes are applied to the solder resist 4 such that openings are formed in positions corresponding to the electrodes 3 and positions corresponding to forming positions of the second opening portions 7 described later. Therefore, as shown in FIG. 1B, the first opening portions 6 and the second opening portions 7 are formed in the solder resist 4.

The first opening portions 6 are formed in positions opposing to the electrodes 3 that are formed on the substrate main body 2. Also, the second opening portions 7 are provided on dicing lines of the substrate main body 2 (wafer). That is, the second opening portions 7 are formed in boundary positions between plural element areas A formed on the substrate main body 2. The substrate main body 2 is exposed to the outside in the positions where the second opening portions 7 are formed.

Figure 1C:
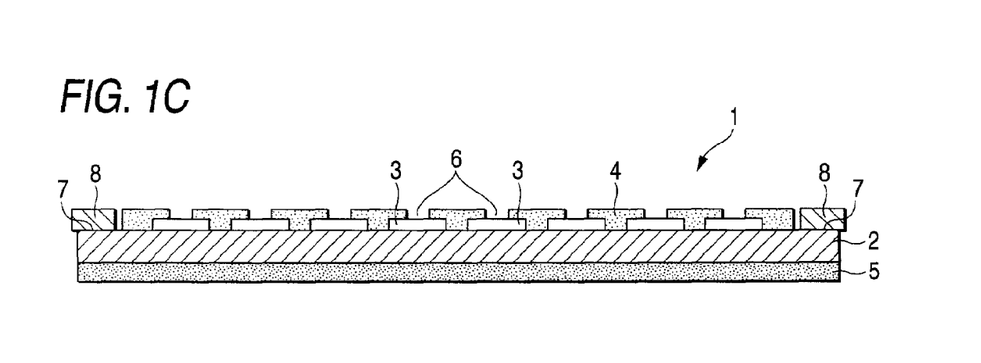

After the first opening portions 6 and the second opening portions 7 are formed in the solder resist 4 as described above, a flux mask 8 (first mask set forth in claims) is then provided on the substrate 1. This flux mask 8 is a mask made of a metal, and is provided to cover all or a part of the second opening portions 7. Also, a thickness of the flux mask 8 is set to the almost same thickness (30 to 40 µm) as that of the solder resist 4.

Figure 1D:
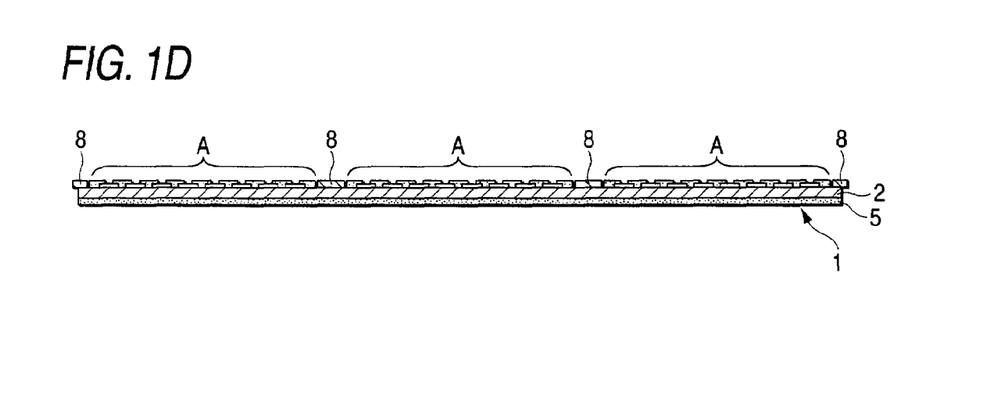

FIG. 1D is a view showing the substrate 1 when viewed from a broad point of view. The flux mask 8 has a lattice-like shape that has opening portions in the element areas A. The flux mask 8, when fitted to the substrate 1, covers all of the second opening portions 7 that are formed to coincide with the dicing lines.

Figure 2A:
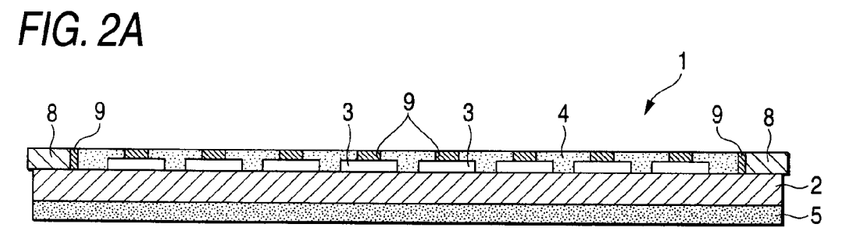
FIGS. 2A to 2D are views explaining the solder ball mounting method as the embodiment of the present invention in line with procedures.

When the flux mask 8 is fitted to the substrate 1, a flux 9 is filled in the first opening portions 6 by using this flux mask 8. As the method of filling the flux 9 in the first opening portions 6, for example, the printing method can be used. FIG. 2A shows a state that the flux 9 is filled in the first opening portions 6.

Figure 2B:
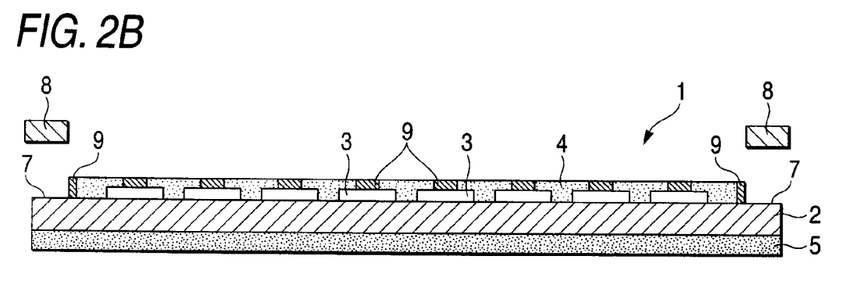

As described above, a thickness of the flux mask 8 is almost equal to a thickness of the solder resist 4. Therefore, the flux 9 is filled to bury each of the first opening portions 6. However, the flux 9 never protrudes from the upper surface of the solder resist 4, unlike the first related art (see FIG. 5C). However, the situation that the flux 9 still remains slightly on the upper surface of the solder resist 4 is similar to that explained in the second related art. Then, as shown in FIG. 2B, the flux mask 8 is removed from the substrate 1 when the process of filling the flux 9 is finished.

Figure 2C:
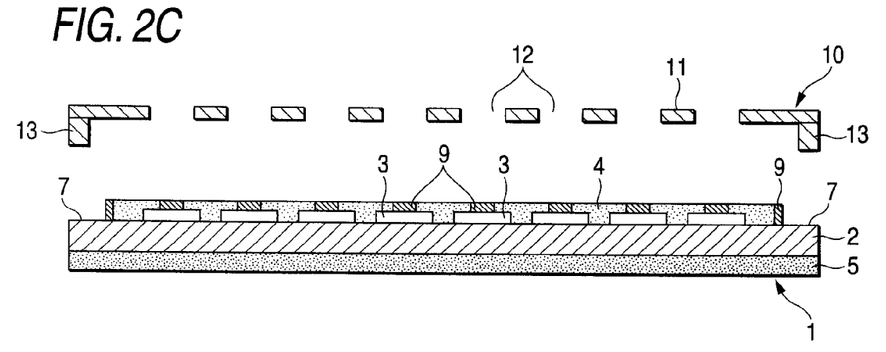

Then, as shown in FIG. 2C, a ball mounting mask 10 (second mask set forth in claims) is arranged over the substrate 1. This ball mounting mask 10 is composed of a masking portion 11 and a supporting portion 13.

A plurality of ball feeding openings 12 used to mount solder balls 15 on the substrate 1 are formed in the masking portion 11. A diameter of this ball feeding opening 12 is set slightly larger than a diameter of the solder ball 15, and a difference between diameters is set to a value that enables to feed properly the solder ball.

Figure 2D:
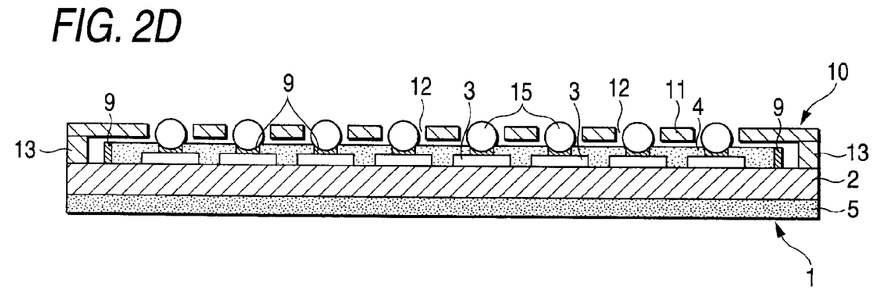

The supporting portion 13 performs a function of supporting the masking portion 11 over the substrate 1. As shown in FIG. 2D, the masking portion 11 is supported by the supporting portion 13 such that this masking portion 11 is away from the upper surface of the solder resist 4. In this manner, since the masking portion 11 is separated from the upper surface of the solder resist 4, it can be prevented that the flux 9 still remaining on the upper surface of the solder resist 4 adheres to the masking portion 11.

Here, a height of the supporting portion 13 constituting the ball mounting mask 10 is 50 to 60 µm, for example. Also, a thickness of the solder resist 4 is 30 to 40 µm. Therefore, a clearance of 10 to 30 µm is formed between the upper surface of the solder resist 4 and the lower surface of the masking portion 11. In this case, a thickness of the masking portion 11 is 30 to 40 µm, for example.

When the ball mounting mask 10 is arranged over the substrate 1, the solder balls 15 are supplied to the ball mounting mask 10, and then the solder balls 15 are fed into the ball feeding openings 12 by using the squeegee. FIG. 2D shows a state that the solder balls 15 are fed into the ball feeding openings 12. In this state, respective solder balls 15 are mounted (temporarily fitted) on the flux 9 with a viscosity.

Figure 3A:
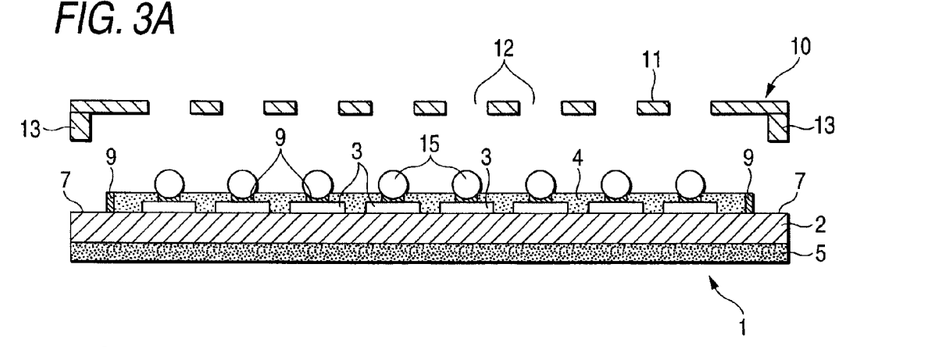
FIGS. 3A to 3D are views explaining the solder ball mounting method as the embodiment of the present invention in line with procedures.
Figure 3B:
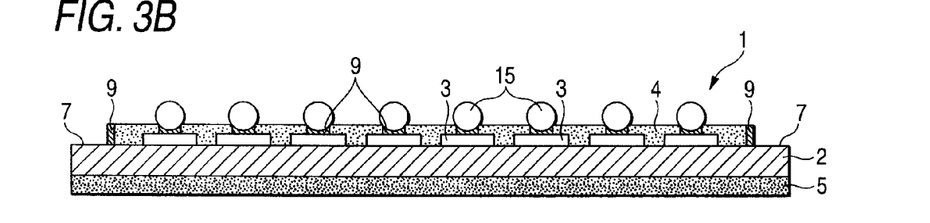
Figure 3C:
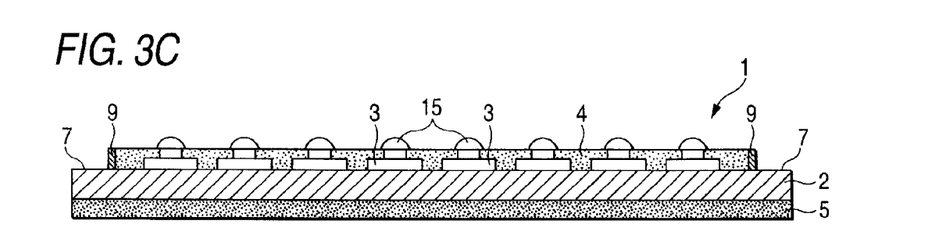

After the solder balls 15 are mounted on the flux 9 in this manner, the ball mounting mask 10 is removed from the substrate 1, as shown in FIG. 3A. FIG. 3B shows the substrate 1 from which the ball mounting mask 10 is removed.

Figure 3D:
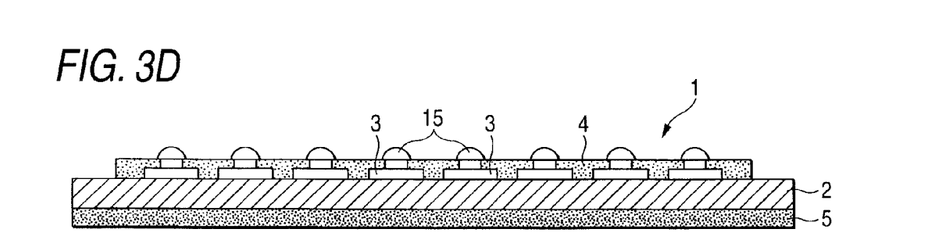

Then, the heating process such as the reflowing process, or the like is executed, and the solder balls 15 are joined to the electrodes 3. Then, a flux cleaning process of removing the remaining flux 9, and the like is carried out. Accordingly, as shown in FIG. 3D, the ball-mounted substrate 1 is manufactured.

As described above, in the solder ball mounting method according to the present embodiment, the flux 9 is filled in the first opening portions 6 after the flux mask 8 having the almost same thickness as the solder resist 4 is provided in the second opening portions 7, as explained with reference to FIG. 1C and FIG. 2A. Therefore, even when the flux mask 8 is removed from the substrate 1 after the flux 9 is filled, the flux 9 never protrudes from the upper surface of the solder resist 4.

Also, the present embodiment is constructed such that the masking portion 11 is kept away from the upper surface of the solder resist 4 by providing the supporting portion 13 to the ball mounting mask 10. Therefore, it can be prevented that the flux 9 sticks to the masking portion 11, and also it can be prevented that, when the ball mounting mask 10 shown in FIG. 3A is removed from the substrate 1, the solder balls 15 as well as the ball mounting mask 10 are removed from the substrate 1. Also, it can be prevented that, since the flux 9 does not protrude from the upper surface of the solder resist 4, the solder balls 15 are moved from the flux 9.

Also, the flux mask 8 is provided to the second opening portion 7 in filling the flux 9 in the first opening portions 6. Therefore, the position of the substrate 1 corresponding to the flux mask 8 is covered with the flux mask 8. As a result, the flux 9 never adheres to the substrate 1 (concretely, the positions of the substrate 1 corresponding to the second opening portions 7) upon filling the flux 9.

Also, the ball mounting mask 10 is arranged over the substrate 1 such that the supporting portion 13 is positioned in the position of the second opening portion 7 (a mask arranging position). Therefore, the supporting portion 13 is never adhered to the substrate 1 by the remaining flux 9. As a result, the ball mounting mask 10 can be removed smoothly from the substrate 1 and the ball mounting mask 10 is never deformed, so that the solder ball 15 can be prevented from moving from a predetermined position without fail. Also, as described above, the ball mounting mask 10 can be released easily from the substrate 1. Therefore, the process of mounting the solder balls 15 on the substrate 1 can be executed easily with good workability.

In addition, the second opening portion 7 is provided to coincide with the dicing line of the substrate main body 2 (wafer) along which the element areas A are diced into individual pieces. Therefore, even when the second opening portion 7 with which the supporting portion 13 of the ball mounting mask 10 come in touch is provided on the substrate 1, the element areas A are never restricted. In case a thin rectangular circuit substrate for the gang printing, or the like is employed as the substrate main body 2, the second opening portion 7 is provided to the cutting lines along which the element areas A are divided into individual pieces respectively.

Then, a ball mounted substrate 20 manufactured by using the above solder ball mounting method will be explained with reference to FIG. 4 hereunder. This ball mounted substrate 20 is constructed such that solder balls 15A are formed on a lower portion and also solder balls 15B are formed on an upper portion. Also, an example in which the so-called build-up substrate is employed as the substrate main body 2 is shown.

The substrate main body 2 has a core substrate 17 made of the prepreg, for example, and a plurality of via plugs 21 are formed to pass through this core substrate 17. Also, wiring layers 24 connected to the via plugs 21 are formed on a lower surface of the core substrate 17 in FIG. 4, and wiring layers 25 connected to the via plugs 21 are formed on an upper surface of the core substrate 17 in FIG. 4.

An insulating layer 18 for covering the wiring layers 24 is formed on a surface of the core substrate 17 on the side on which the wiring layers 24 are formed, while an insulating layer 19 for covering the wiring layers 25 is formed on a surface of the core substrate 17 on the side on which the wiring layers 25 are formed. Also, electrodes 3A are formed on a lower surface of the insulating layer 18 in FIG. 4, while electrodes 3B and wiring layers 26 are formed on an upper surface of the insulating layer 19 in FIG. 4. Also, via plugs 22 are formed between the electrodes 3A and the wiring layers 24 to pass through the insulating layer 18, and via plugs 23 are formed between the electrodes 3B and the wiring layers 25 to pass through the insulating layer 19.

Figure 4:
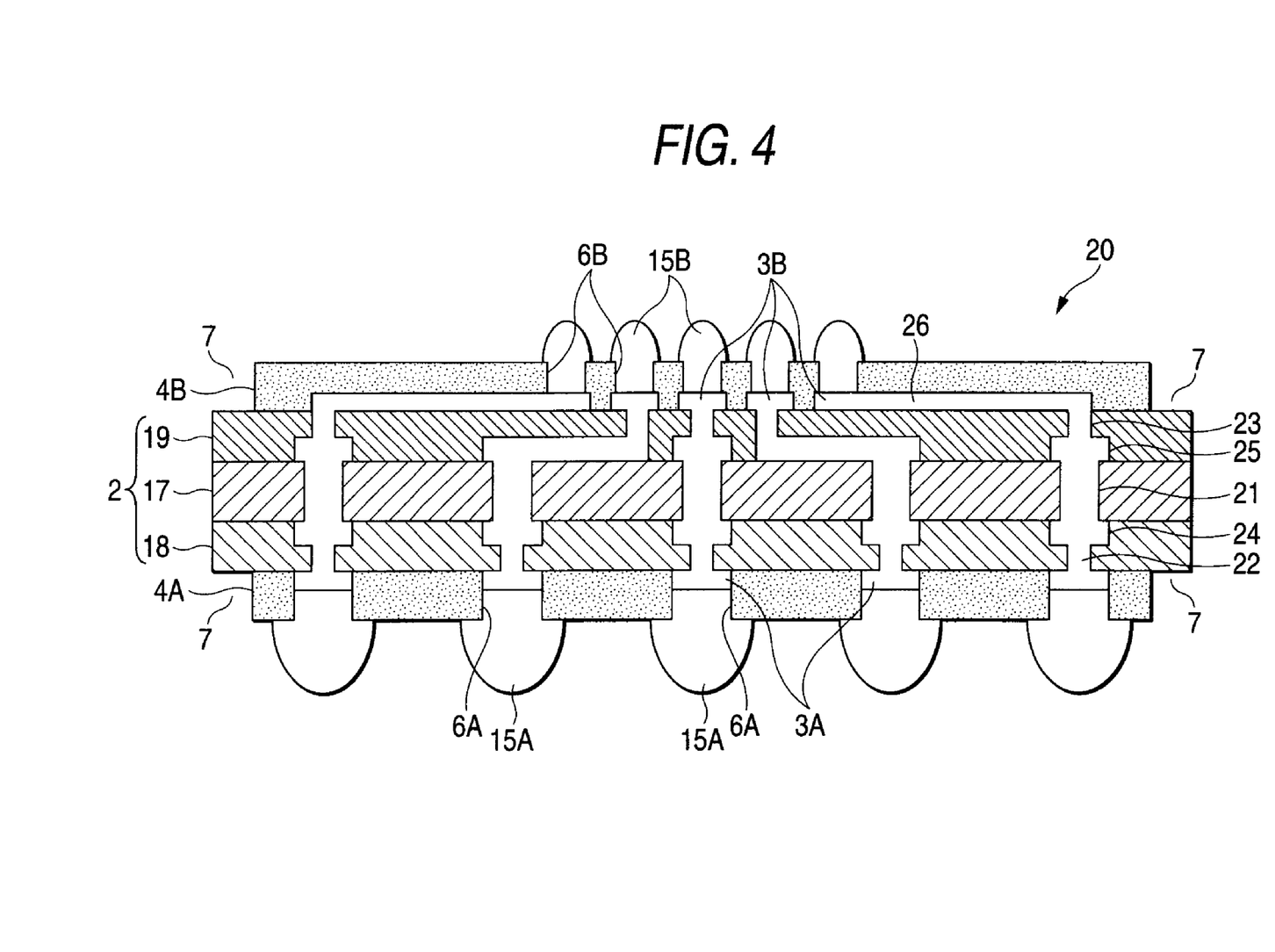
FIG. 4 is a sectional view showing a solder ball mounting substrate manufactured by using the solder ball mounting method as the embodiment of the present invention.

Also, a solder resist 4A is formed on the lower surface of the insulating layer 18 in FIG. 4. The solder balls 15A joined to the electrodes 3A are mounted in first opening portions 6A, which are formed in the solder resist 4A, by the above solder ball mounting method. Also, a solder resist 4B is formed on the upper surface of the insulating film 19 in FIG. 4. The solder ball 15B joined to the electrodes 3B are mounted in first opening portions 6B, which are formed in the solder resist 4B, by the above solder ball mounting method.

A semiconductor chip (not shown) is mounted on the solder balls 15B of the ball mounted substrate 20 constructed as above by flip-chip bonding. Also, the solder balls 15A are used in mounting the ball mounted substrate 20 on a mounting substrate by flip-chip bonding. In this case, the second opening portion 7 used to provide the ball mounting mask 10 is still left in outer peripheral positions of the solder resists 4A, 4B formed on both surfaces of the substrate main body 2, respectively.

In this manner, the application of the present invention is not limited to the wafer (the substrate main body 2) explained with reference to FIG. 1A to FIG. 3D. The present invention can be applied to the ball mounted substrate in which the build-up substrate is employed as the substrate main body 2.

Also, the provision position of the solder balls 15 is not limited to one surface of the substrate main body 2, as shown in FIG. 1A to FIG. 3D. The invention of this application can be applied to the ball mounted substrate in which the solder balls 15 are arranged on both surfaces of the substrate main body 2, as shown in FIG. 4.

Also, in the above ball mounted substrate 20, for example, the prepreg material may be employed as the core substrate 17, and the so-called build-up resin such as epoxy material, polyimide material, or the like may be employed as the insulating layers 18, 19. Also, Cu may be employed as the via plugs 21 to 23, the wiring layers 24 to 26, and the electrodes 3A, 3B.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for mounting solder balls on electrodes formed on an upper surface of a substrate comprising the steps of:
    forming an insulating material on the upper surface of the substrate over the electrodes;
    forming first opening portions in the insulating material to expose the electrodes;
    forming second opening portions in the insulating material and thereby exposing the substrate;
    arranging a first mask in the second opening portions on the upper surface of the substrate such that the first mask has a thickness substantially the same as a thickness of the insulating material;
    filling a flux in the first opening portions and onto the electrodes whereby the first mask prevents the flux from filling in the second opening portions;
    removing the first mask from the substrate so as to expose the second opening portions;
    providing a second mask having a supporting portion and a masking portion;
    arranging the second mask over the substrate such that the supporting portion is received in the second opening portions on the upper surface of the substrate and the masking portion is set above the insulating material such that the masking portion does not contact the insulating material;
    forming ball feeding openings in the masking portion of the second mask such that the ball feeding openings are arranged over the first opening portions;
    depositing mounting the solder balls on the flux formed on the electrodes;
    removing the second mask from the substrate; and
    joining the solder balls to the electrodes.

2. A solder ball mounting method according to claim 1, wherein the insulating material is a solder resist.

3. A solder ball mounting method according to claim 1, wherein the substrate is a wafer, and the second opening portion is positioned in a dicing position of the wafer.

4. A method of manufacturing a substrate in which solder balls are mounted on electrodes formed on a substrate main body, comprising: a step of mounting the solder balls on the electrodes by using the solder ball mounting method set forth in claim 1.

* * * * *